United States Patent
Xia et al.

(10) Patent No.: US 8,836,032 B2
(45) Date of Patent: Sep. 16, 2014

(54) FIN-BASED ADJUSTABLE RESISTOR

(75) Inventors: Wei Xia, Irvine, CA (US); Xiangdong Chen, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 194 days.

(21) Appl. No.: 13/277,547

(22) Filed: Oct. 20, 2011

(65) Prior Publication Data

US 2013/0099317 A1   Apr. 25, 2013

(51) Int. Cl.
*H01L 27/12* (2006.01)
*H01L 29/78* (2006.01)

(52) U.S. Cl.
CPC ....... *H01L 29/785* (2013.01); *H01L 2029/7857* (2013.01)
USPC .................. 257/348; 257/E27.112

(58) Field of Classification Search
None
See application file for complete search history.

(56) References Cited

U.S. PATENT DOCUMENTS

2008/0272407 A1* 11/2008 Kapoor ......................... 257/270
2008/0277729 A1* 11/2008 Gossner et al. ............... 257/360

* cited by examiner

*Primary Examiner* — Sonya D McCall Shepard
(74) *Attorney, Agent, or Firm* — Oblon, Spivak, McClelland, Maier & Neustadt, L.L.P.

(57) ABSTRACT

According to one exemplary embodiment, a fin-based adjustable resistor includes a fin channel of a first conductivity type, and a gate surrounding the fin channel. The fin-based adjustable resistor also includes first and second terminals of the first conductivity type being contiguous with the fin channel, and being situated on opposite sides of the fin channel. The fin channel is lower doped relative to the first and second terminals. The resistance of the fin channel between the first and second terminals is adjusted by varying a voltage applied to the gate so as to achieve the fin-based adjustable resistor. The gate can be on at least two sides of the fin channel. Upon application of a depletion voltage, the fin channel can be depleted before an inversion is formed in the fin channel.

18 Claims, 5 Drawing Sheets

US 8,836,032 B2

FIN-BASED ADJUSTABLE RESISTOR

BACKGROUND OF THE INVENTION

1. Field of the Invention

The present invention is generally in the field of semiconductor devices. More particularly, the invention relates to fabrication of resistors in semiconductor devices.

2. Background Art

Many circuits fabricated using CMOS processes require a resistor. It is advantageous to use a CMOS process to fabricate a resistor on a substrate with other components of a circuit as an integrated circuit (IC). A polysilicon (poly) resistor can commonly be fabricated on a substrate with other components of a circuit in a CMOS process. It may be desirable to adjust a resistance of the resistor in the circuit. One example is in a radio frequency (RF) analog circuit, where the resistor may receive a signal as an input to an amplifier. If the resistor remains highly conductive when the signal is off, substantial crosstalk and noise can be introduced into the circuit. However, if the resistor is a poly resistor, its resistance cannot be adjusted and the resistor remains highly conductive. Furthermore, disconnecting the poly resistor would require an additional circuit.

A planar gate transistor may be used as a resistor where a voltage applied to a gate of the planar gate transistor is used to adjust its resistance. However, among other disadvantages, as the voltage changes, the resistance of the resistor would change in a highly non-linear manner. Thus, it would be difficult to control the resistance of the resistor. Furthermore, the amount of adjustment that could be made to the resistance would be limited. For example, a channel of the planar gate transistor would be inverted at a certain point well before it could be completely depleted. As such, using a planar gate transistor as a resistor cannot, for example, adequately prevent or reduce crosstalk and noise in a circuit.

It would be desirable to provide for a resistor that has an adjustable resistance and that can be fabricated using a CMOS process, while overcoming drawbacks and deficiencies of the art.

SUMMARY OF THE INVENTION

A fin-based adjustable resistor is provided. Features, advantages and various embodiments of the present invention are shown in and/or described in connection with at least one of the drawings, and are set forth more completely in the claims.

DETAILED DESCRIPTION OF THE INVENTION

The present invention is directed to a fin-based adjustable resistor. The following description contains specific information pertaining to the implementation of the present invention. One skilled in the art will recognize that the present invention may be implemented in a manner different from that specifically discussed in the present application. Moreover, some of the specific details of the invention are not discussed in order not to obscure the invention.

The drawings in the present application and their accompanying detailed description are directed to merely exemplary embodiments of the invention. To maintain brevity, other embodiments of the present invention are not specifically described in the present application and are not specifically illustrated by the present drawings.

Figure 1A:
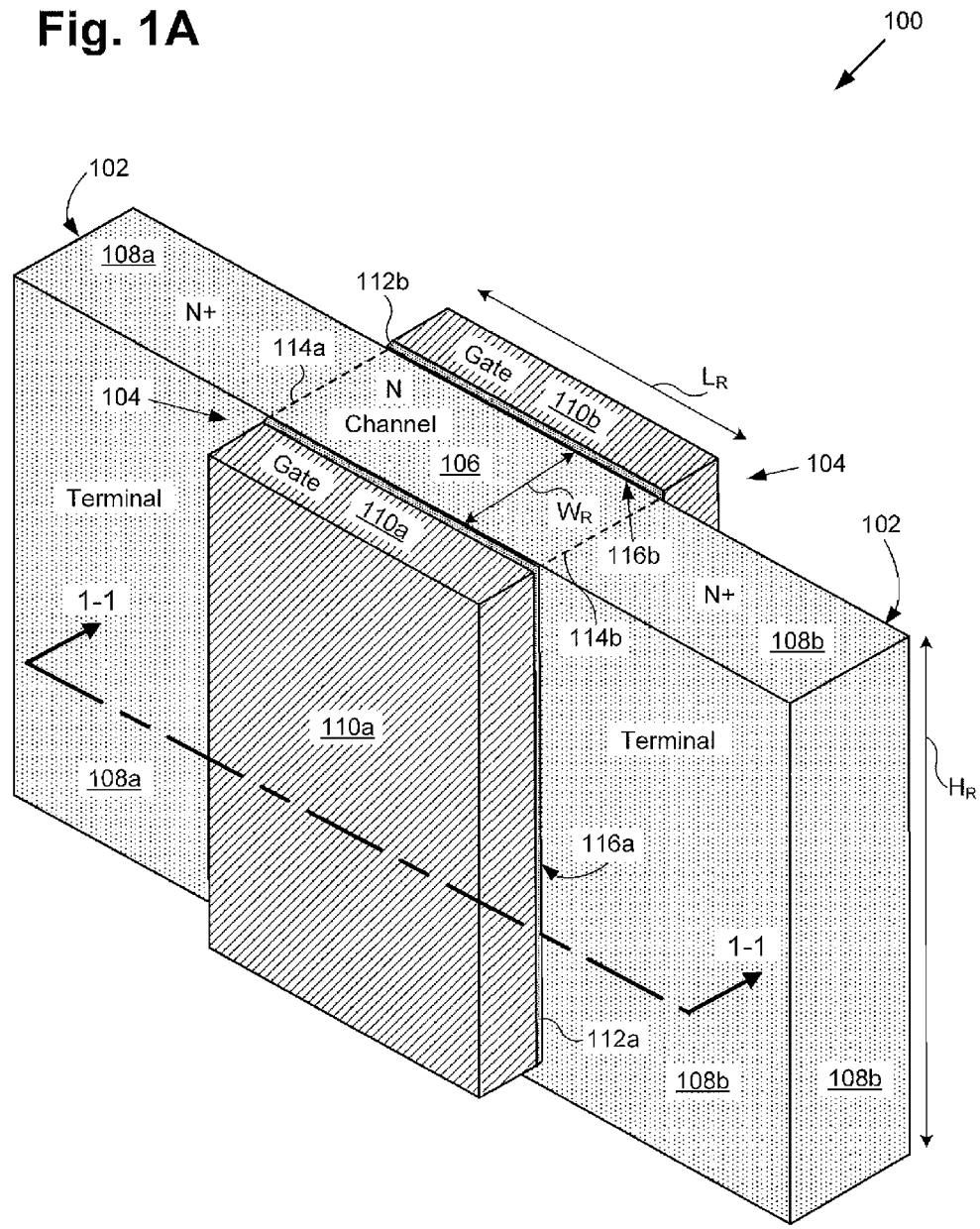
FIG. 1A shows an exemplary fin-based adjustable resistor, according to one embodiment of the invention.

FIG. 1A shows an exemplary fin-based adjustable resistor 100 (also referred to herein as "resistor 100"), according to one embodiment of the invention. Resistor 100 includes fin 102 and gate 104. Fin 102 comprises fin channel 106 and terminals 108a and 108b. Gate 104 comprises gate electrodes 110a and 110b and gate dielectrics 112a and 112b.

In resistor 100, terminals 108a and 108b are contiguous with fin channel 106 and are situated on opposite sides of fin channel 106. For example, in the present embodiment, terminal 108a is situated on side 114a of fin channel 106 and terminal 108b is situated on side 114b of fin channel 106 with fin channel 106 therebetween. Fin channel 106 and terminals 108a and 108b are of a first conductivity type. In the present embodiment, fin channel 106 is lower doped relative to terminals 108a and 108b. For example, FIG. 1A shows an embodiment where the first conductivity type is N type with fin channel 106 having N conductivity and terminals 108a and 108b having N+ conductivity. As such, terminals 108a and 108b are highly conductive and can be utilized for connection to fin channel 106. It will be appreciated that in other embodiments, the first conductivity type can be P type.

In the present embodiment, fin 102 is a semiconductor fin and resistor 100 is formed on a semiconductor substrate. More particularly, fin 102 is silicon, and as such, fin channel 106 and terminals 108a and 108b are each silicon. In one embodiment, the semiconductor substrate comprises a device layer on an insulator, where fin 102 is formed in the device layer. A handle layer may be included under the insulator. For example, in the present embodiment, resistor 100 is formed on a silicon on insulator (SOI) substrate. Thus, fin 102 is formed on an insulator, such as a dielectric layer. In other embodiments, resistor 100 is not formed on an insulator. For example, resistor 100 may be formed on a doped semiconductor substrate.

In forming resistor 100 on an SOI substrate, a device layer of the SOI substrate may be doped to form at least one N type well. The N type well can then be etched and doped to form fin channel 106 and to form terminals 108a and 108b as fin terminals. In forming fin 102, a mask can be utilized, such that the N type well remains as fin channel 106 after doping. As such, in one embodiment, fin channel 106 is an N type well. Many circuits fabricated using CMOS processes require a resistor. Advantageously, a CMOS process can be used to fabricate resistor 100 on a substrate with other components of a circuit as an integrated circuit (IC). For example, by forming fin channel 106 as an N type well, fabrication of resistor 100 is compatible with a CMOS process. In one embodiment, the CMOS process can include fabrication of a fin field-effect transistor (finFET) where another N type well that is formed concurrently with the N type well is utilized in the finFET. The CMOS process can be, for example, a 14 nanometer or less foundry process.

It is noted that fin 102 can comprise any suitable semiconductor material, including, as examples, silicon, germanium, gallium arsenide, and the like, and can be fabricated in any suitable manner. Also, while terminals 108a and 108b have been described as being integral to fin 102, terminals 108a and 108b can be any suitable terminal capable of facilitating connection to fin channel 106.

Figure 2:
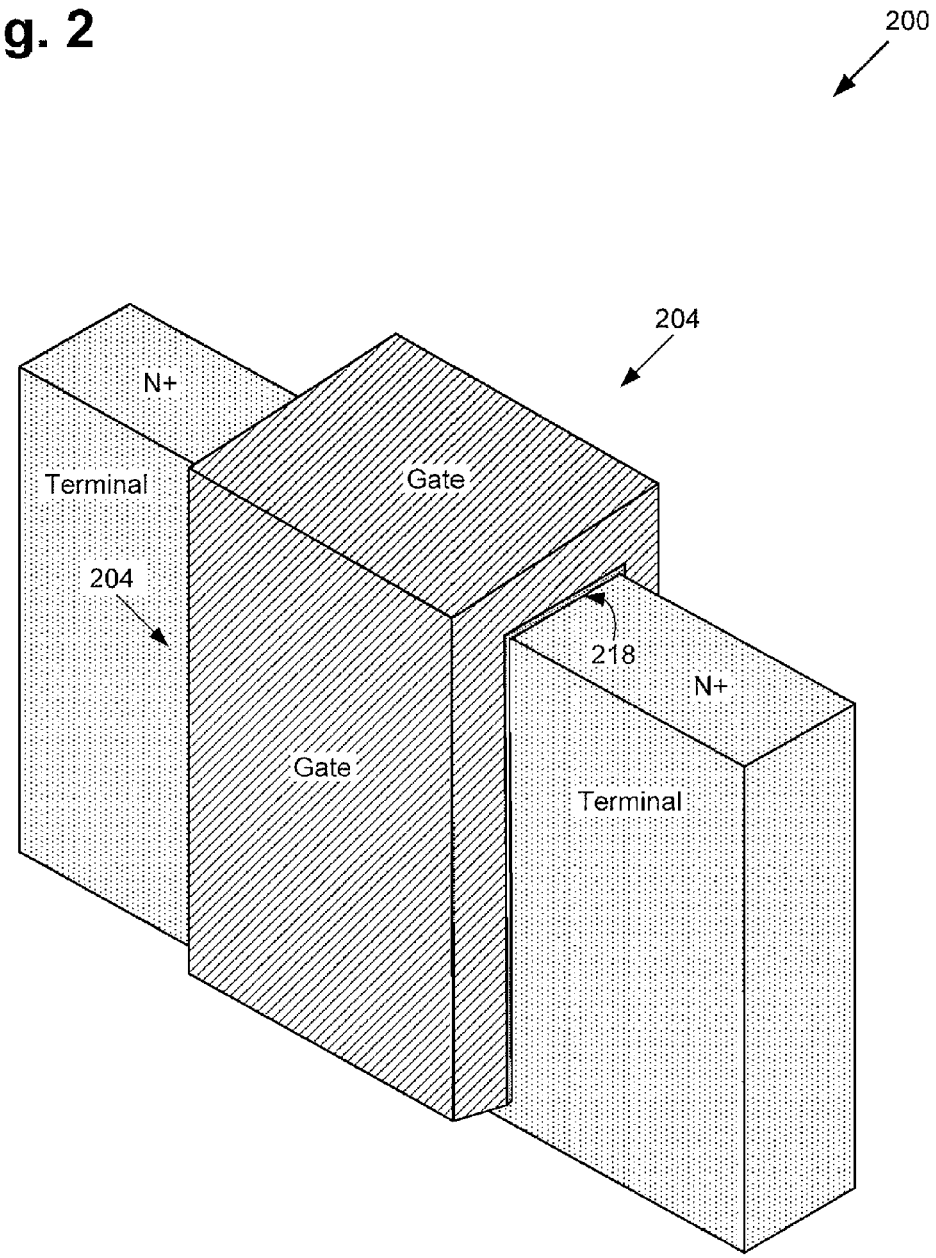
FIG. 2 shows an exemplary fin-based adjustable resistor, according to one embodiment of the invention.

In resistor 100, gate 104 is surrounding fin channel 106 and is on at least two sides of fin channel 106. For example, FIG. 1A shows gate 104 on sides 116a and 116b of fin channel 106 sandwiched in between. In one embodiment, gate 104 is only on one side of fin channel 106, such as side 116a or side 116b. While resistor 100 only has gate 104 on two sides of fin channel 106, in some embodiments, gate 104 is also on top of fin channel 106. For example, FIG. 2 shows fin-based adjustable resistor 200, corresponding to fin-based adjustable resistor 100 in FIG. 1A. Fin-based adjustable resistor 200 can be similar to or the same as fin-based adjustable resistor 100 except that gate 204 is formed on top 218 of its fin channel, which corresponds to fin channel 106 in FIG. 1A and is covered by gate 204.

Referring again to FIG. 1A, gate 104 can comprise any suitable gate materials, such as those employed in a finFET or other transistor. Gate electrodes 110a and 110b can comprise, for example, at least one of doped polysilicon and gate metal, such as tantalum (Ta), tantalum nitride (TaN), titanium nitride (TiN), molybdenum (Mo), ruthenium (Ru), and tantalum carbide nitride (TaCN), and can both be capacitively coupled to fin channel 106 through respective gate dielectrics 112a and 112b. Gate dielectrics 112a and 112b can comprise, for example, at least one of silicon oxide ($SiO_2$), silicon nitride ($Si_3N_4$), and high-K dielectrics, such as hafnium oxide ($HfO_2$), zirconium oxide ($ZrO_2$), and the like.

As terminals 108a and 108b are highly conductive, in the present embodiment, a resistance of resistor 100 is primarily determined by fin channel 106. Fin channel 106 has length $L_R$, width $W_R$, and height $H_R$. As specific examples, width $W_R$ can be approximately 30 nanometers to approximately 100 nanometers, length $L_R$ can be approximately 20 nanometers to at least micrometers, and height $H_R$ can be approximately 60 nanometers to approximately 100 nanometers.

Figure 1B:
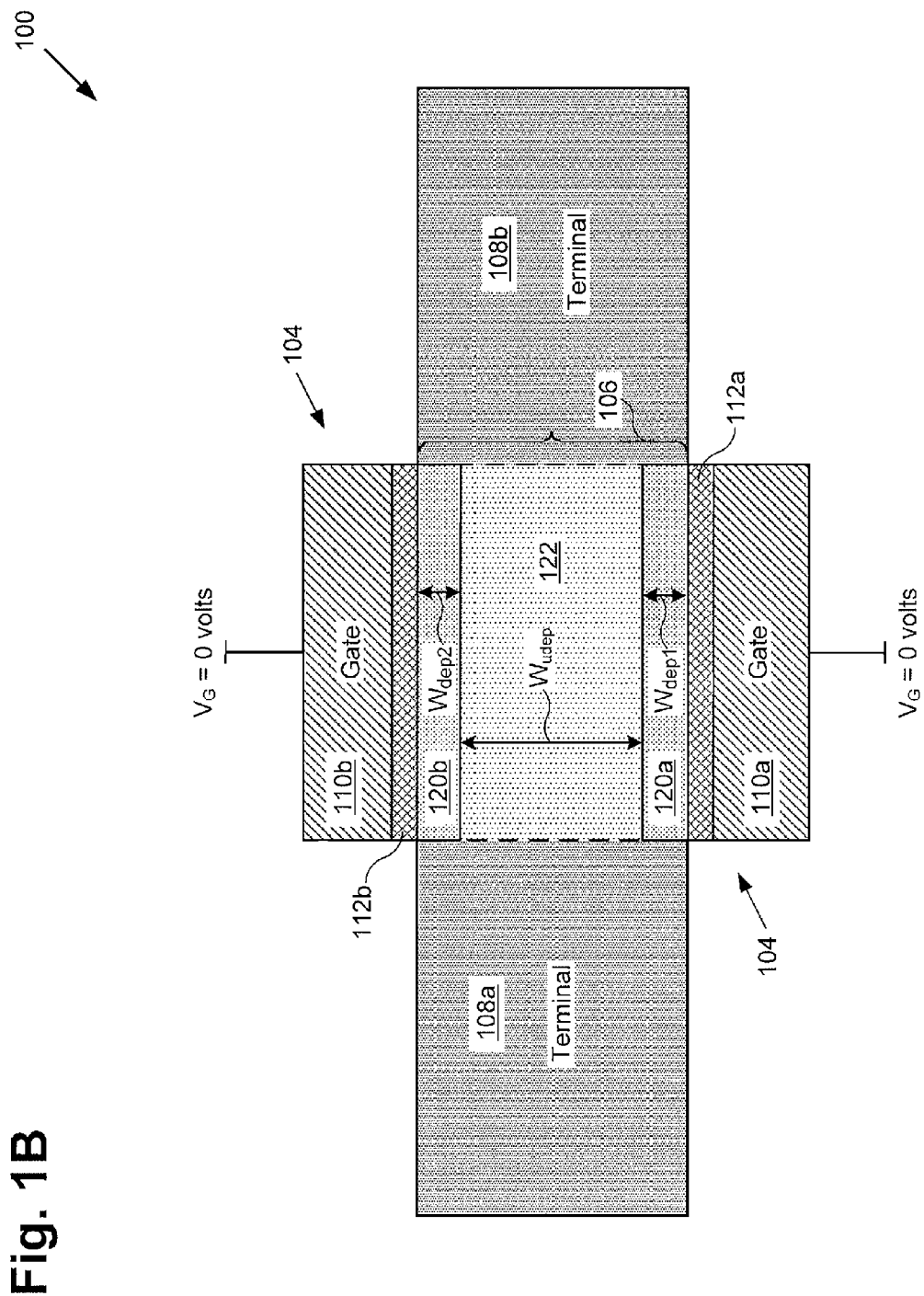
FIG. 1B shows a cross-sectional view of an exemplary fin-based adjustable resistor, according to one embodiment of the invention.

Referring now to FIG. 1B, FIG. 1B shows a cross-sectional view of fin-based adjustable resistor 100, which corresponds to cross-section 1-1 in FIG. 1A. As shown in FIG. 1B, when 0 volts is applied to gate 104, fin channel 106 has depletion regions 120a and 120b and undepleted region 122. Depletion region 120a is of width $W_{dep1}$, depletion region 120b is of width $W_{dep2}$, and undepleted region 122 is of width $W_{udep}$. Depletion regions 120a and 120b are non-conductive and undepleted region 122 is conductive. As such, a resistance of fin channel 106 is a function of length $L_R$, height $H_R$, width $W_{udep}$, and a material resistivity of fin channel 106 as modified by doping. As an example, fin channel 106 can have a doping concentration of approximately 1E16 atoms per cubic cm to approximately 1E17 atoms per cubic cm.

Figure 1C:
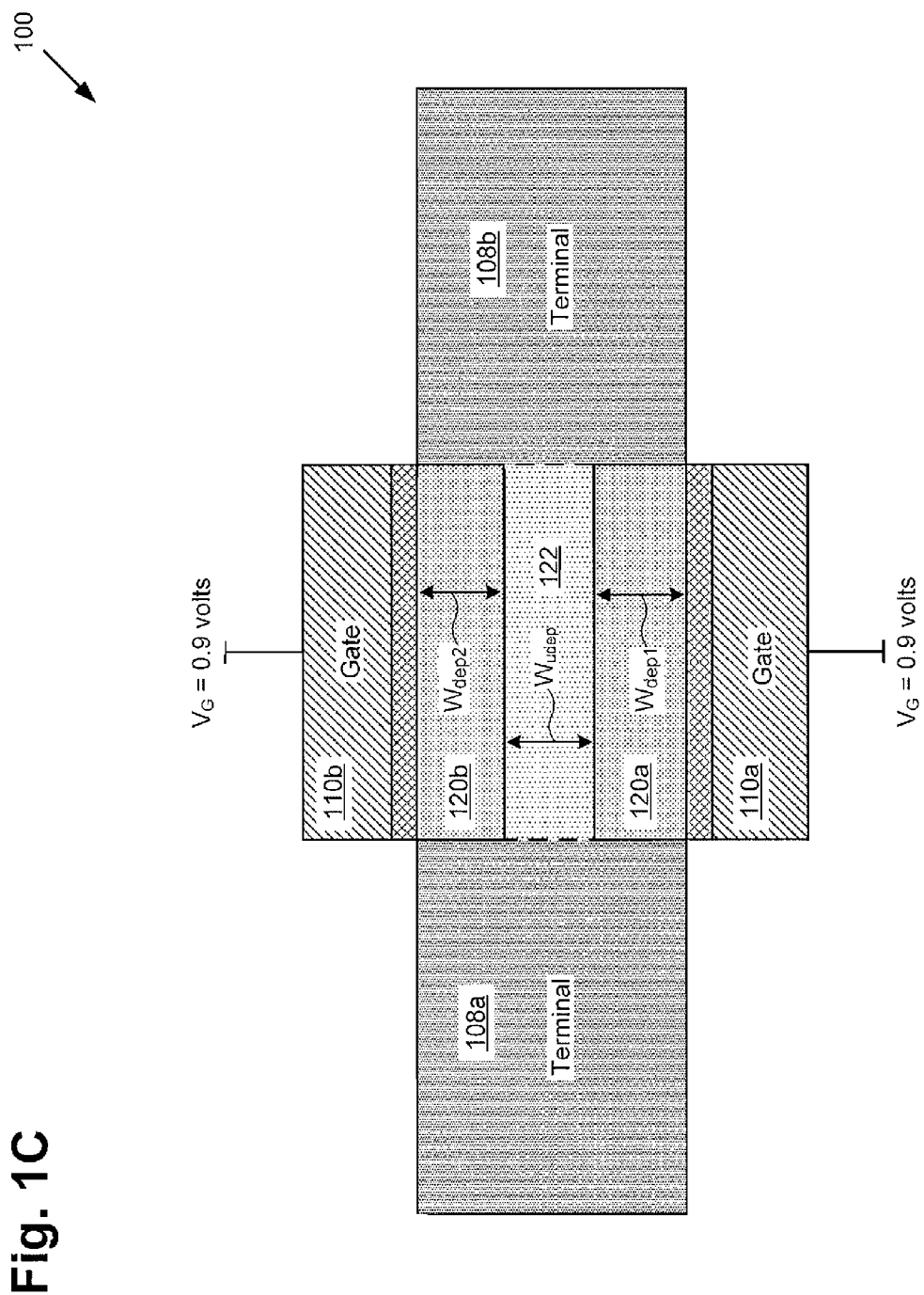
FIG. 1C shows a cross-sectional view of an exemplary fin-based adjustable resistor, according to one embodiment of the invention.

In resistor 100, a resistance of fin channel 106 between terminals 108a and 108b is adjusted by varying voltage $V_G$ applied to gate 104 so as to achieve fin-based adjustable resistor 100. Referring now to FIG. 1C, FIG. 1C shows a cross-sectional view of fin-based adjustable resistor 100, which corresponds to cross-section 1-1 in FIG. 1A. FIG. 1C corresponds to FIG. 1B where the resistance of fin channel 106 between terminals 108a and 108b has been adjusted by varying voltage $V_G$ applied to gate 104. In FIG. 1C, voltage $V_G$ is approximately 0.9 volts. As illustrated by FIG. 1C, varying voltage $V_G$ applied to gate 104 varies width $W_{udep}$ of undepleted region 122 that is surrounded by depletion regions 120a and 120b. In the embodiment shown, increasing voltage $V_G$, which is a positive voltage, has increased width $W_{dep1}$ of depletion region 120a and width $W_{dep2}$ of 120b. As such, width $W_{udep}$ of undepleted region 122 is decreased, thereby increasing the resistance of resistor 100. Thus, voltage $V_G$ controls width $W_{dep1}$ of depletion region 120a and width $W_{dep2}$ of 120b, which in turn controls the resistance of resistor 100.

A planar gate transistor may be used as a resistor where a voltage applied to a gate of the planar gate transistor is used to adjust its resistance. However, among other disadvantages, as the voltage changes, the resistance of the resistor would change in a highly non-linear manner. Thus, it would be difficult to control the resistance of the resistor. However, in the present embodiment, the resistance of fin channel 106 is adjusted substantially linearly by varying voltage $V_G$ applied to gate 104. Furthermore, with the planar gate transistor, the amount of adjustment that could be made to the resistance would be limited. For example, a channel of the planar gate transistor would turn into an inversion at a certain point well before it could be completely depleted. As such, using a planar gate transistor as a resistor cannot, for example, adequately prevent or reduce crosstalk and noise in a radio frequency (RF) analog circuit, where the resistor receives a signal as an input to an amplifier. However, the amount of adjustment that can be made to the resistance of resistor 100 is very flexible. For example, in the present embodiment, upon application of a depletion voltage fin channel 106 is completely depleted along width $W_R$ before an inversion is formed in fin channel 106 so as to substantially block conduction of resistor 100.

Figure 1D:
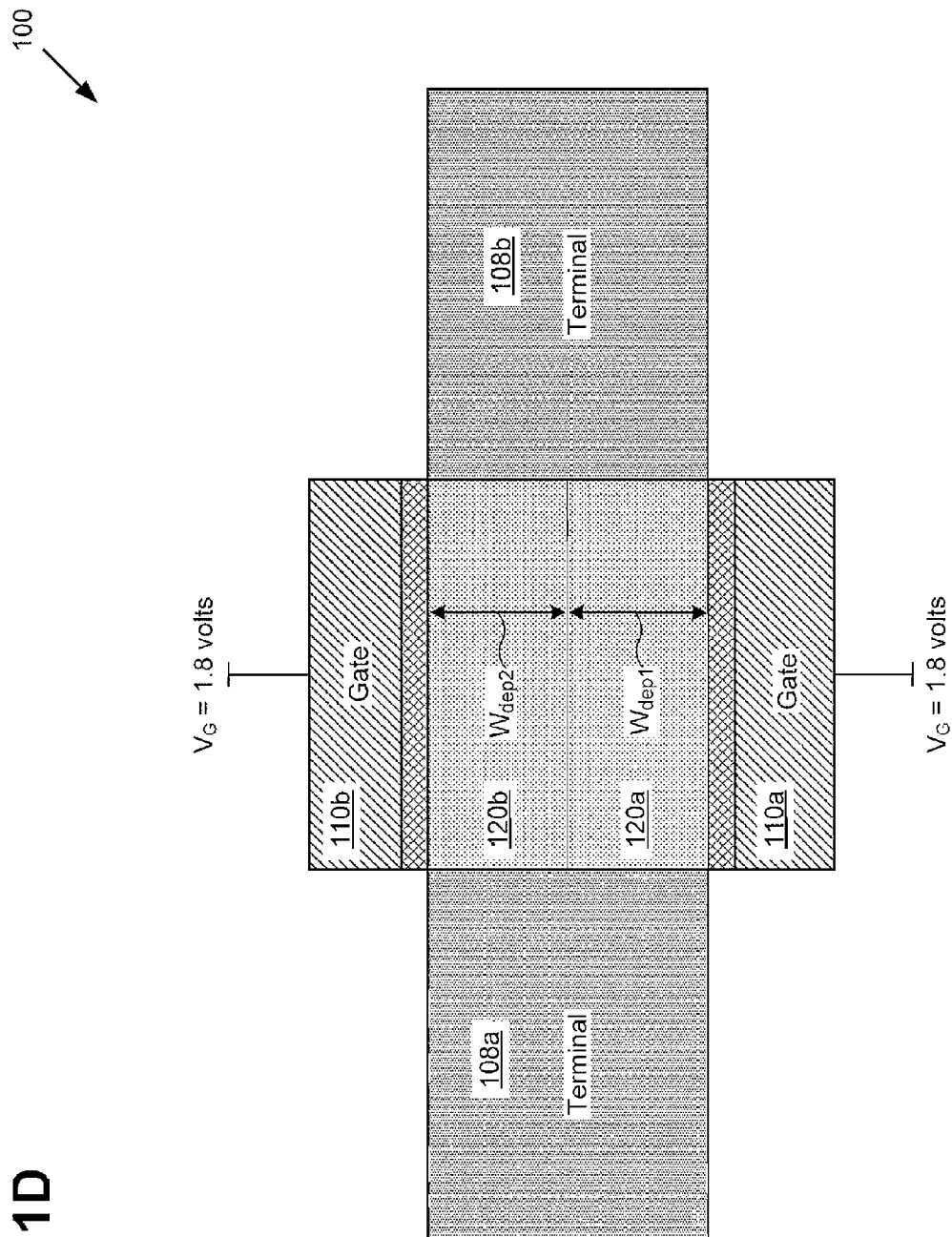
FIG. 1D shows a cross-sectional view of an exemplary fin-based adjustable resistor, according to one embodiment of the invention.

Referring now to FIG. 1D, FIG. 1D shows a cross-sectional view of fin-based adjustable resistor 100, which corresponds to cross-section 1-1 in FIG. 1A. FIG. 1D corresponds to FIG. 1C where the resistance of fin channel 106 between terminals 108a and 108b has been adjusted by varying voltage $V_G$ applied to gate 104. More particularly, voltage $V_G$ has been increased to 1.8 volts, which is a depletion voltage in the present embodiment. At the depletion voltage, fin channel 106 is completely depleted, such that depleted regions 120a and 120b merge and undepleted region 122 is substantially eliminated between depleted regions 120a and 120b. In other words, fin channel 106 can no longer conduct current between terminals 108a and 108b. As such, resistor 100 can be used, for example, to adequately prevent or reduce crosstalk and noise in an RF analog circuit.

While the present embodiment includes one gate 104 and one fin channel 106, in other embodiments, fin 102 has more than one gate and more than one fin channel. Also, in the present embodiment, gate electrodes 110a and 110b are shorted so as to be at a same voltage $V_G$. However, in other embodiments, gate electrodes 110a and 110b are not shorted such that each can receive a different voltage or a same voltage. While upon application of a depletion voltage fin channel 106 is completely depleted before an inversion is formed in fin channel 106, in other embodiments, fin channel 106 is not capable of being completely depleted. Furthermore, it is to be appreciated that all voltages described herein are merely exemplary and may depend on the doping of fin 102, as well as other factors. For example, while in the present embodiment, a resistance of fin channel 106 between terminals 108a and 108b is increased by increasing voltage $V_G$ applied to gate 104, in other embodiments, a resistance of fin channel 106 between terminals 108a and 108b is decreased by increasing voltage $V_G$ applied to gate 104.

Thus, as discussed above with respect to FIGS. 1A-1D and FIG. 2, embodiments of the present invention can provide for a resistor, such as fin-based resistor 100, that has an adjustable resistance and that can be fabricated using a CMOS process, while overcoming drawbacks and deficiencies of the art.

From the above description of the invention it is manifest that various techniques can be used for implementing the concepts of the present invention without departing from its scope. Moreover, while the invention has been described with specific reference to certain embodiments a person of ordinary skill in the art would appreciate that changes can be made in form and detail without departing from the spirit and the scope of the invention. Thus, the described embodiments are to be considered in all respects as illustrative and not restrictive. It should also be understood that the invention is not limited to the particular embodiments described herein but is capable of many rearrangements, modifications, and substitutions without departing from the scope of the invention.

The invention claimed is:

1. A fin-based adjustable resistor, said fin-based adjustable resistor comprising:
   a fin channel of a first conductivity type;
   a gate surrounding said fin channel;
   first and second terminals of said first conductivity type being contiguous with said fin channel, and being situated on opposite sides of said fin channel;
   said fin channel being lower doped relative to said first and second terminals;
   wherein a resistance of said fin channel between said first and second terminals is adjusted by varying a voltage applied to said gate so as to achieve said fin-based adjustable resistor, and
   upon application of a depletion voltage said fin channel is depleted before an inversion is formed in said fin channel.

2. The fin-based adjustable resistor of claim 1, wherein said first and second terminals are formed as fin terminals.

3. The fin-based adjustable resistor of claim 1, wherein said fin channel and said first and second terminals comprise silicon.

4. The fin-based adjustable resistor of claim 1, comprising depletion regions of said fin channel, wherein varying said voltage applied to said gate varies an undepleted region that is surrounded by said depletion regions.

5. The fin-based adjustable resistor of claim 1, wherein said first conductivity type is N type.

6. The fin-based adjustable resistor of claim 1, wherein said fin channel is within an N type well.

7. The fin-based adjustable resistor of claim 1, wherein said fin-based adjustable resistor is in a silicon on insulator substrate.

8. The fin-based adjustable resistor of claim 1, wherein the gate is situated on only two sides of said fin channel.

9. A fin-based adjustable resistor, said fin-based adjustable resistor comprising:
   a fin channel of a first conductivity type;
   a gate surrounding said fin channel;
   first and second terminals of said first conductivity type being contiguous with said fin channel, and being situated on opposite sides of said fin channel;
   said fin channel being lower doped relative to said first and second terminals;
   wherein a resistance of said fin channel between said first and second terminals is adjusted by varying a voltage applied to said gate so as to achieve said fin-based adjustable resistor, and
   wherein said resistance of said fin channel is adjusted substantially linearly by varying said voltage applied to said gate.

10. A fin-based adjustable resistor, said fin-based adjustable resistor comprising:
    a fin channel of a first conductivity type;
    a gate surrounding said fin channel;
    first and second fin terminals of said first conductivity type being contiguous with said fin channel, and being situated on opposite sides of said fin channel;
    said fin channel being lower doped relative to said first and second fin terminals;
    wherein upon application of a depletion voltage said fin channel is depleted before an inversion is formed in said fin channel.

11. The fin-based adjustable resistor of claim 10, wherein said gate is on two sides of said fin channel.

12. The fin-based adjustable resistor of claim 10, wherein said gate is on two sides of said fin channel and is on top of said fin channel.

13. The fin-based adjustable resistor of claim 10, wherein said first and second terminals are formed as fin terminals.

14. The fin-based adjustable resistor of claim 10, wherein said fin channel and said first and second terminals comprise silicon.

15. The fin-based adjustable resistor of claim 10, wherein a resistance of said fin channel is adjusted substantially linearly by varying said depletion voltage.

16. The fin-based adjustable resistor of claim 10, comprising depletion regions of said fin channel, wherein varying said depletion voltage varies an undepleted region that is surrounded by said depletion regions.

17. The fin-based adjustable resistor of claim 10, wherein said first conductivity type is N type.

18. The fin-based adjustable resistor of claim 10, wherein said fin channel is within an N type well.

* * * * *